United States Patent
Tang et al.

(10) Patent No.: US 12,111,572 B2
(45) Date of Patent: *Oct. 8, 2024

(54) METHODS OF GREYTONE IMPRINT LITHOGRAPHY TO FABRICATE OPTICAL DEVICES

(71) Applicant: Applied Materials, Inc., Santa Clara, CA (US)

(72) Inventors: Hao Tang, San Jose, CA (US); Kang Luo, Santa Clara, CA (US); Erica Chen, Cupertino, CA (US); Yongan Xu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,290

(22) Filed: Jun. 12, 2023

(65) Prior Publication Data
US 2023/0341769 A1    Oct. 26, 2023

Related U.S. Application Data

(63) Continuation of application No. 17/740,116, filed on May 9, 2022, now Pat. No. 11,709,423.
(Continued)

(51) Int. Cl.
*G03F 7/00* (2006.01)
*G02B 5/18* (2006.01)

(52) U.S. Cl.
CPC .......... *G03F 7/0005* (2013.01); *G02B 5/1857* (2013.01); *G03F 7/0002* (2013.01)

(58) Field of Classification Search
CPC .......... G02B 5/1857; G02B 2027/0178; G02B 27/0172; G02B 6/10; G03F 7/0002;
(Continued)

(56) References Cited

U.S. PATENT DOCUMENTS

| 7,691,275 B2 | 4/2010 | Willson et al. |
| 11,112,694 B2 | 9/2021 | LaBonte et al. |

(Continued)

FOREIGN PATENT DOCUMENTS

| JP | 2008-006639 A | 1/2008 |
| JP | 2019-200440 A | 11/2019 |

(Continued)

OTHER PUBLICATIONS

Christopherson, M. et al., Multiple height calibration reference for nano-metrology, Metrology, Proceedings of SPIE—The International Society for Optical Engineering, 2015.
(Continued)

*Primary Examiner* — Deoram Persaud
(74) *Attorney, Agent, or Firm* — Patterson & Sheridan LLP

(57) ABSTRACT

A method of imprinting a pattern on a substrate is provided. The method includes forming a first pattern on a plurality of masters using a method other than imprinting, the first pattern including a plurality of patterned features of varying sizes; measuring the patterned features at a plurality of locations on each of the masters; selecting a first master of the plurality of masters based on the measurements of the patterned features on each of the masters; using the first master to form a second pattern on an imprint template; and imprinting the first pattern on a first device with the imprint template.

20 Claims, 20 Drawing Sheets

Related U.S. Application Data

(60) Provisional application No. 63/186,319, filed on May 10, 2021.

(58) Field of Classification Search
CPC . G03F 7/0005; G03F 1/38; G03F 1/50; G03F 9/00
See application file for complete search history.

(56) References Cited

U.S. PATENT DOCUMENTS

| | | | |
|---|---|---|---|
| 2003/0165749 A1* | 9/2003 | Fritze | B82Y 10/00 430/394 |
| 2016/0320696 A1* | 11/2016 | Nishimura | G03F 7/0002 |
| 2021/0286132 A1* | 9/2021 | Kurunczi | G03F 7/0005 |
| 2021/0294014 A1 | 9/2021 | Evans et al. | |

FOREIGN PATENT DOCUMENTS

| | | |
|---|---|---|
| KR | 100543130 B1 | 1/2006 |
| KR | 10-2008-0110709 A | 12/2008 |

OTHER PUBLICATIONS

International Search Report and Written Opinion for International Application No. PCT/US2022/028338 dated Aug. 23, 2022.

\* cited by examiner

METHODS OF GREYTONE IMPRINT LITHOGRAPHY TO FABRICATE OPTICAL DEVICES

CROSS-REFERENCE TO RELATED APPLICATIONS

This application is a continuation application which claims the benefit of co-pending U.S. patent application Ser. No. 17/740,116 filed May 9, 2022, which claims priority to U.S. Provisional Patent Application No. 63/186,319, filed on May 10, 2021, the contents of each which are herein incorporated by reference.

BACKGROUND

Field

Embodiments of the present disclosure generally relate to optical devices for augmented, virtual, and mixed reality. More specifically, embodiments described herein provide for methods of fabricating optical devices via greytone imprint lithography.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment. Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Optical devices are used to assist in overlaying images. Generated light is propagated through a waveguide until the light exits the waveguide and is overlayed on the ambient environment. Fabricating optical devices can be challenging as optical devices tend to have non-uniform properties. Accordingly, improved systems and method of fabricating optical devices are needed in the art.

SUMMARY

In one embodiment, a method of imprinting a pattern on a substrate is provided. The method includes forming a first pattern on a plurality of masters using a method other than imprinting, the first pattern including a plurality of patterned features of varying sizes; measuring the patterned features at a plurality of locations on each of the masters; selecting a first master of the plurality of masters based on the measurements of the patterned features on each of the masters; using the first master to form a second pattern on an imprint template; and imprinting the first pattern on a first device with the imprint template, a method of imprinting a pattern on a substrate is provided. The method includes forming a first pattern on a plurality of die on each of a plurality of masters using a method other than imprinting, the first pattern on each die including a plurality of patterned features of varying sizes; measuring the patterned features at a plurality of locations on each die on each of the masters; selecting a first die on a first master of the plurality of masters based on the measurements of the patterned features on each die of each of the masters; using the first die on the first master to form a second pattern on an imprint template; and imprinting the first pattern on a first die of a first device with the imprint template, a method of imprinting a pattern on a substrate is provided. The method includes forming a first pattern on a plurality of die on each of a plurality of masters using a method other than imprinting, the first pattern on each die including a plurality of patterned features of varying sizes; measuring the patterned features at a plurality of locations on each die on each of the masters; selecting a first die on a first master of the plurality of masters based on the measurements of the patterned features on each die of each of the masters; using the first die on the first master to form a second pattern on a first imprint template; imprinting the first pattern on each die of a plurality of die of a new master with the first imprint template; using the plurality of die on the new master to form the second pattern on each die of a plurality of die on a second imprint template; and imprinting the first pattern on a plurality of die on a first device with the second imprint template.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to for methods of fabricating optical devices via greytone imprint lithography. Greytone imprint lithography is different than greytone photolithography. As described in detail below, greytone imprint lithography uses imprint templates having patterned features of varying sizes (e.g., structures having varying depths and/or widths) to imprint corresponding patterned features on an imprint resist layer disposed on a substrate. The imprint templates can be used repeatedly to form the same patterned features on numerous substrates, for example during the manufacturing of optical devices, such as during the forming of optical gratings for waveguide combiners used for augmented reality applications.

On the other hand, greytone photolithography uses radiation (e.g., visible light, UV light, etc.) instead of imprinting to form patterned features having varying sizes (e.g., structures having varying depths and/or widths). For example, a greytone mask can be used to vary the amount of radiation that different portions of a photoresist are exposed to during a greytone photolithography process. This varied amount of radiation across the substrate physically alters the photoresist (e.g., changes the solubility with respect to a developer) to different depths and/or widths across the substrate. After the radiation exposure, the photoresist can be developed and subsequently processed to form patterned features having varying sizes (e.g., heights and widths) across the surface of a substrate. Although greytone photolithography can be useful for forming structures having varying depths and/or widths, it has been a challenge to obtain consistent results using greytone photolithography. The following disclosure provides solutions to this problem of inconsistent results for greytone photolithography by instead using a process that combines greytone photolithography with imprint lithography. This combination of greytone photolithography with imprint lithography can be referred to as greytone imprint lithography.

Figure 1:
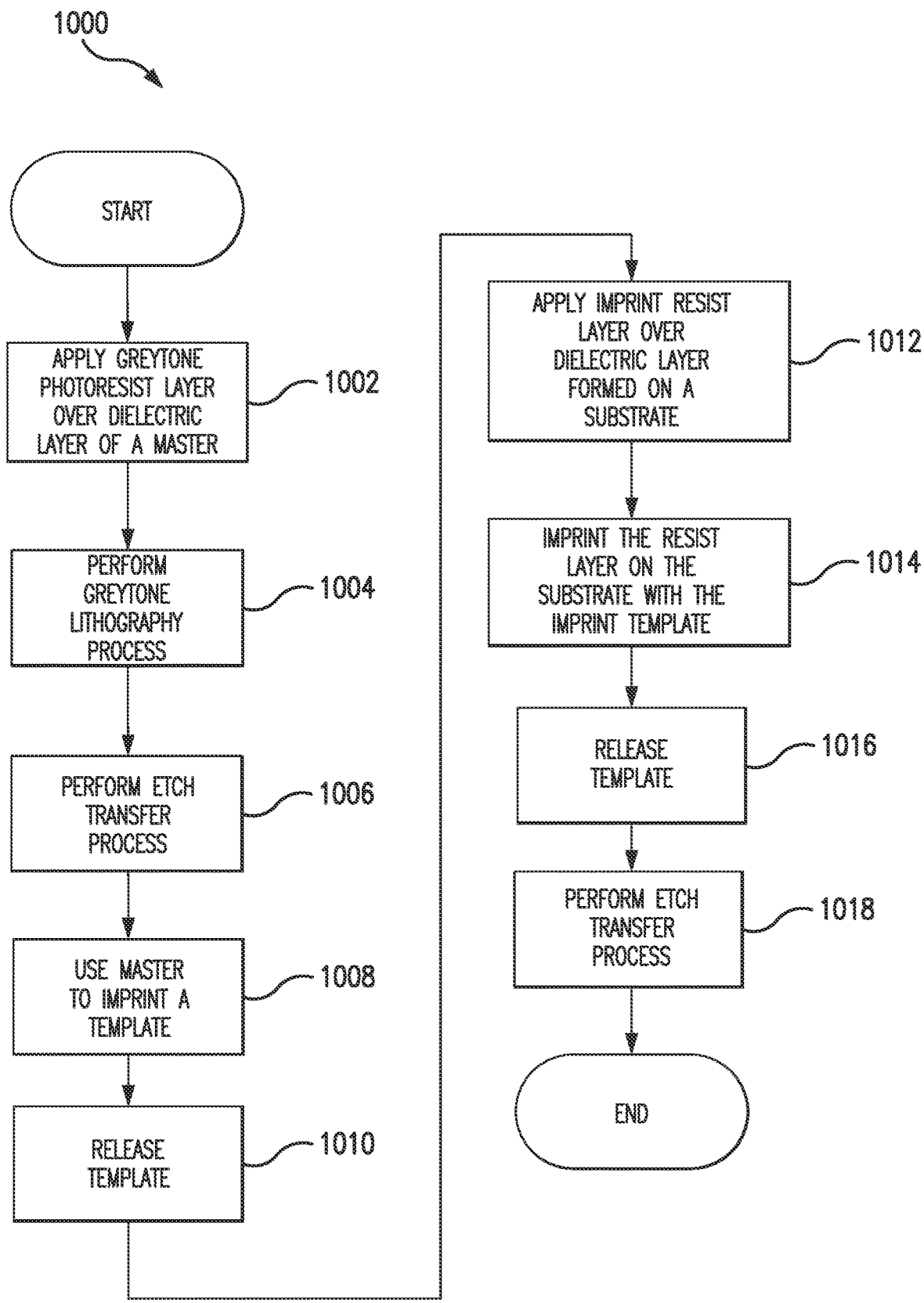
FIG. 1 is a process flow diagram of a method of imprinting a pattern on the optical device shown in FIG. 2I, according to one embodiment.
Figure 2A:
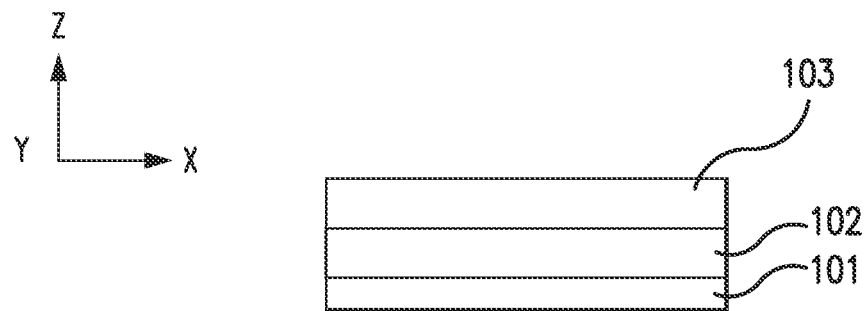
FIGS. 2A-2I show different stages of the method of FIG. 1 for forming the pattern on the optical device shown in FIG. 2I.
Figure 2B:
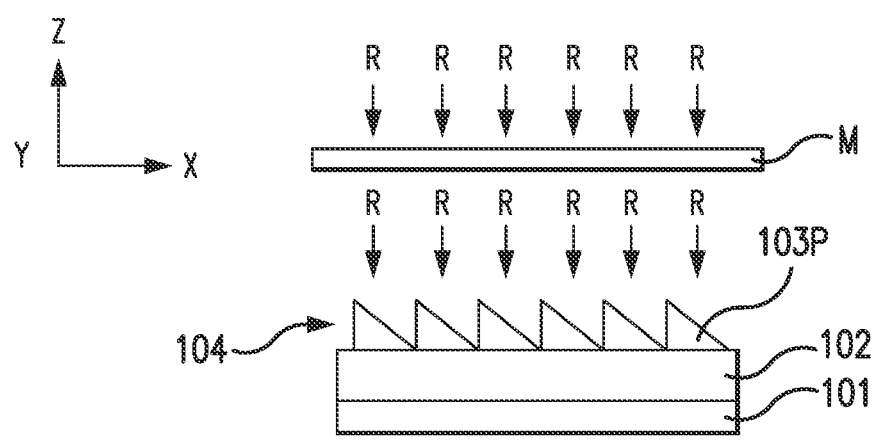
Figure 2C:
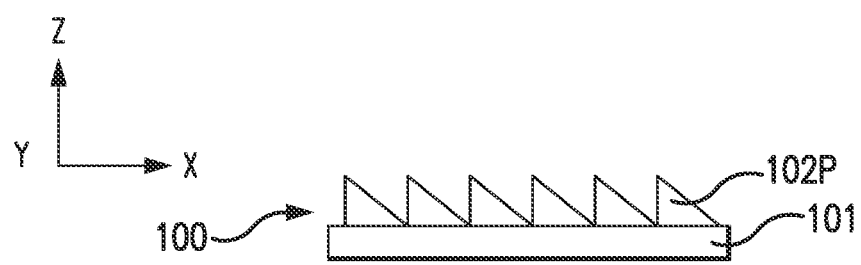
Figure 2D:
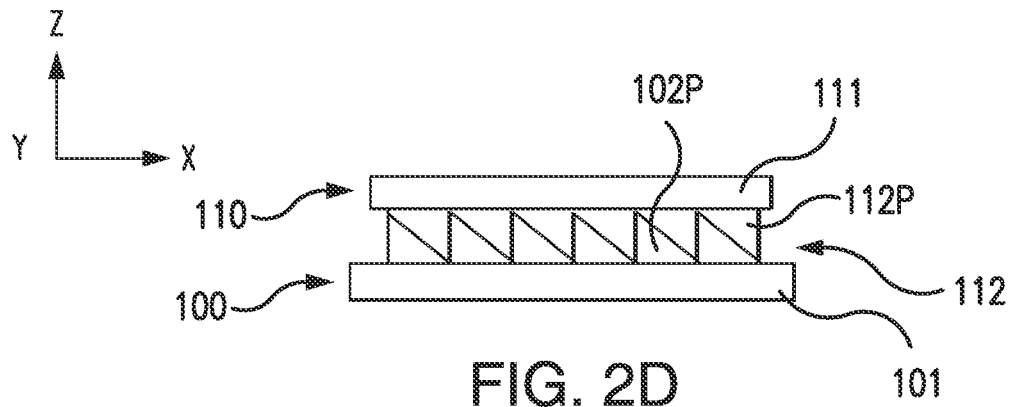
Figure 2E:
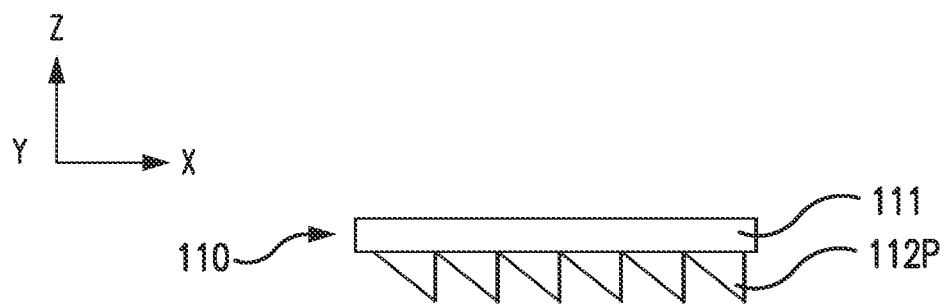
Figure 2F:
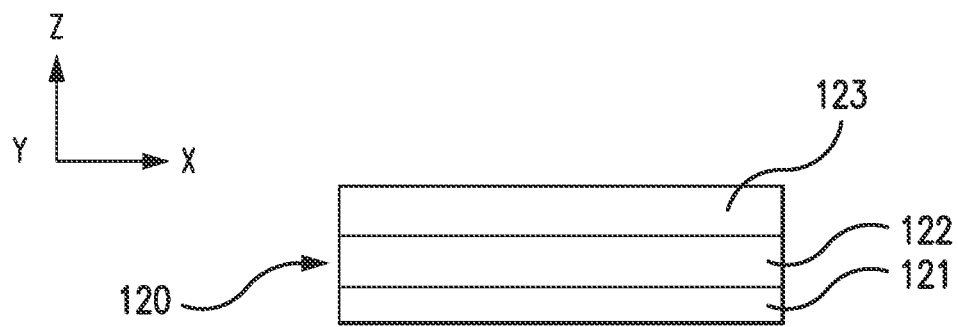
Figure 2G:
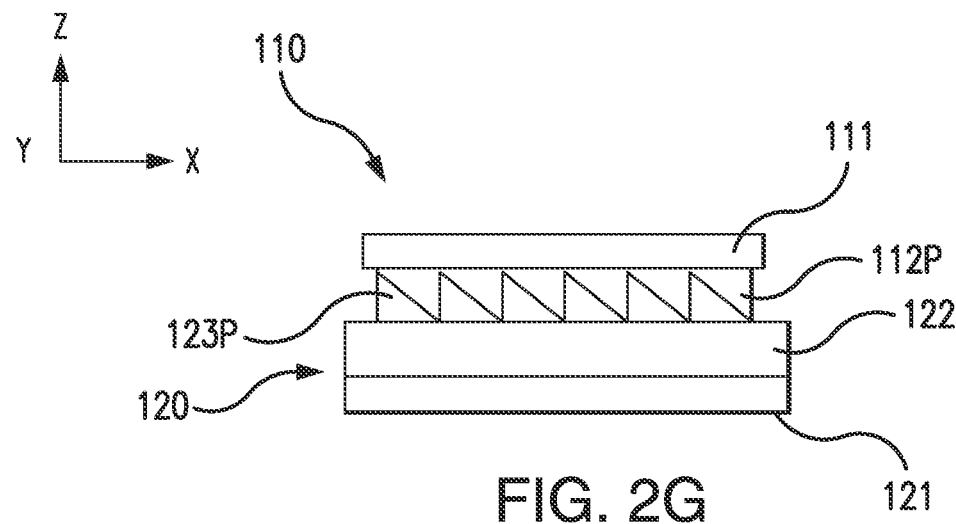
Figure 2H:
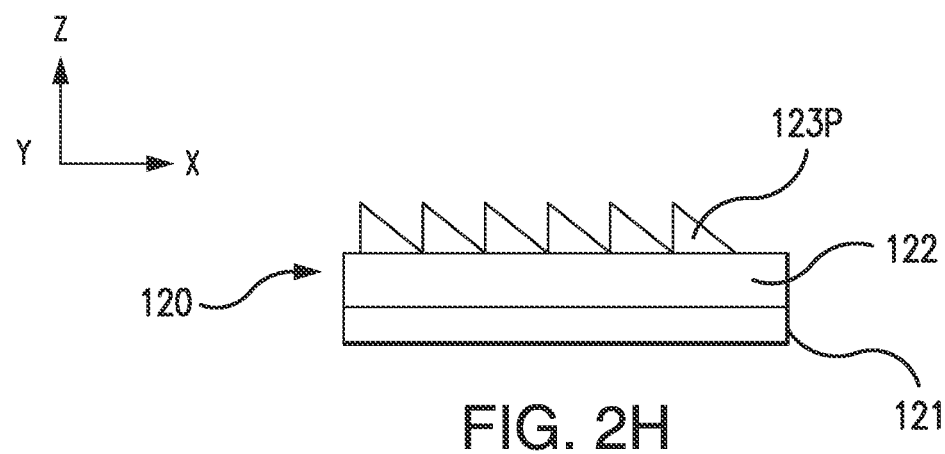
Figure 2I:
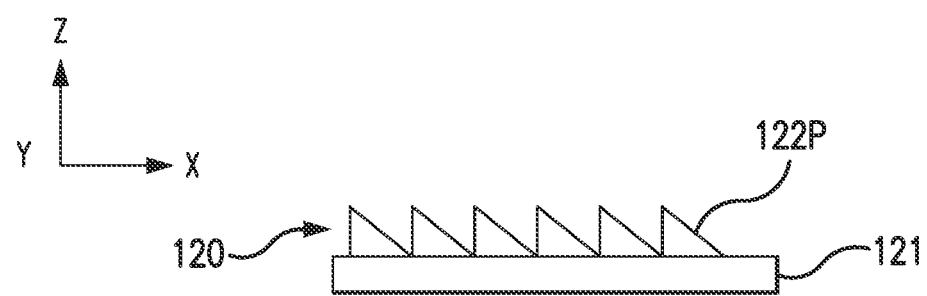

FIG. 1 is a process flow diagram of a method 1000 of imprinting a pattern on the optical device 120 shown in FIG. 2I, according to one embodiment. FIGS. 2A-2I show different stages of the method 1000 for forming the pattern on the optical device 120. The method 1000 is described with reference to FIG. 1 and FIGS. 2A-2I.

At block 1002, with reference to FIG. 2A, a greytone photoresist layer 103 is applied over a dielectric layer 102 of a master 100 (also referred to as master substrate). The dielectric layer 102 can be disposed over a substrate 101 of the master 100. In some embodiments, the substrate 101 can be formed of silicon, quartz, or any other material commonly used for semiconductor substrates or optical device substrates. In some embodiments, the dielectric layer 102 can be formed of silicon oxide or other dielectric material.

At block 1004, with reference to FIG. 2B, a greytone photolithography process is performed on the greytone photoresist layer 103. The greytone photolithography process can include applying radiation R through a greytone mask M to expose the greytone photoresist layer 103 to the radiation R. The greytone mask M is a mask that is configured to allow varying amounts of radiation to pass through different portions of the mask M when the different portions of the mask (i.e., different portions in the XY plane of the mask) are exposed to radiation having the same properties (e.g., intensity, wavelength, frequency, duration, etc.). The varying amount of radiation R directed through the greytone mask M enables the greytone photoresist layer 103 to be altered to varying depths in the Z-direction.

After exposure of portions of the greytone photoresist layer 103 to radiation R using the greytone mask M, the greytone photoresist layer 103 can be developed to remove portions of the greytone photoresist layer 103, such as the uncured portions of the photoresist layer 103. Removal of these portions the greytone photoresist layer 103 leaves a plurality of patterned features 103P as shown in FIG. 2B.

At block 1006, with reference to FIG. 2C, the patterned features 103P of the photoresist layer 103 and the underlying dielectric layer 102 can be etched back to form a plurality of patterned features 102P that are formed of portions of the dielectric layer 102. In some embodiments, the patterned features 102P have a same shape and size and can be arranged in a same pattern as the patterned features 103P of the photoresist layer 103. In some embodiments, the patterned features 102P of the dielectric layer 102 can be more suitable for subsequent processing than the patterned features 103P of the photoresist layer 103. For example, the patterned features 102P of the dielectric layer 102 can be more durable and can have properties that are more suitable for releasing from other materials, such as imprint material described below, than the corresponding patterned features 103P of the photoresist layer 103.

At block 1008, with reference to FIG. 2D, the master 100 with the patterned features 102P can be used imprint patterned features 112P on a template 110. In some embodiments, the patterned features 112P can be a mirror image of the patterned features 102P of the master 100. The template 110 can include a base 111 and an imprint layer 112 formed of an imprintable material. In one embodiment, the imprint layer 112 can be an imprint resist (i.e., a material that can retain an imprinted pattern and in some embodiments the material can be configured to be cured after the imprinting).

At block 1010, with reference to FIG. 2E, the imprint template 110 is released from the master 100. After release the patterned features 112P can be cured (e.g., UV cure) for subsequent processing.

At block 1012, with reference to FIG. 2F, an imprint resist material is applied over a dielectric layer 122 of an optical device 120 to form an imprint resist layer 123. The dielectric layer 122 can be disposed over a substrate 121 of the optical device 120. In some embodiments, the substrate 121 can be formed of silicon, quartz, or any other material commonly used as substrates for optical devices. In some embodiments, the dielectric layer 122 can be formed of silicon oxide or other dielectric layer.

At block 1014, with reference to FIG. 2G, the patterned features 112P of the imprint template 110 can be used to imprint the imprint resist layer 123 of the optical device 120 and form patterned features 123P in the imprint resist layer 123.

At block 1016, with reference to FIG. 2H, the imprint template 110 is released from the optical device 120. After release the patterned features 123P can be cured (e.g., UV cure) for subsequent processing.

At block 1018, with reference to FIG. 2I, the patterned features 123P of the imprint resist layer 123 and the underlying dielectric layer 122 can be etched back to form a plurality of patterned features 122P that are formed of portions of the dielectric layer 122. In some embodiments, the patterned features 122P of the dielectric layer 122 can be components that are configured to transport light through the optical device 120. For example, in one embodiment the patterned features 122P of the optical device can be or include optical gratings of a waveguide combiner to be used in an augmented reality device.

In some embodiments, the patterned features 122P have a same shape and size and can be arranged in a same pattern as the patterned features 123P of the resist layer 123. Furthermore, the patterned features 122P can also have a same shape and size and can be arranged in a same pattern as the patterned features 102P of the master 100, for example as shown in FIG. 2C. Although the patterned features 122P of the optical device 120 can be the same as or highly similar to the patterned features 102P of the master 100, the patterned features 122P of the optical device 120 can be consistently and accurately formed by using the imprint template 110 while the greytone photolithography process used to form the patterned features 102P of the master 100 generates substantially less consistent results when the greytone photolithography process is repeated. The following disclosure describes processes using greytone photolithography and imprint lithography to consistently form patterns on optical devices.

Figure 3:
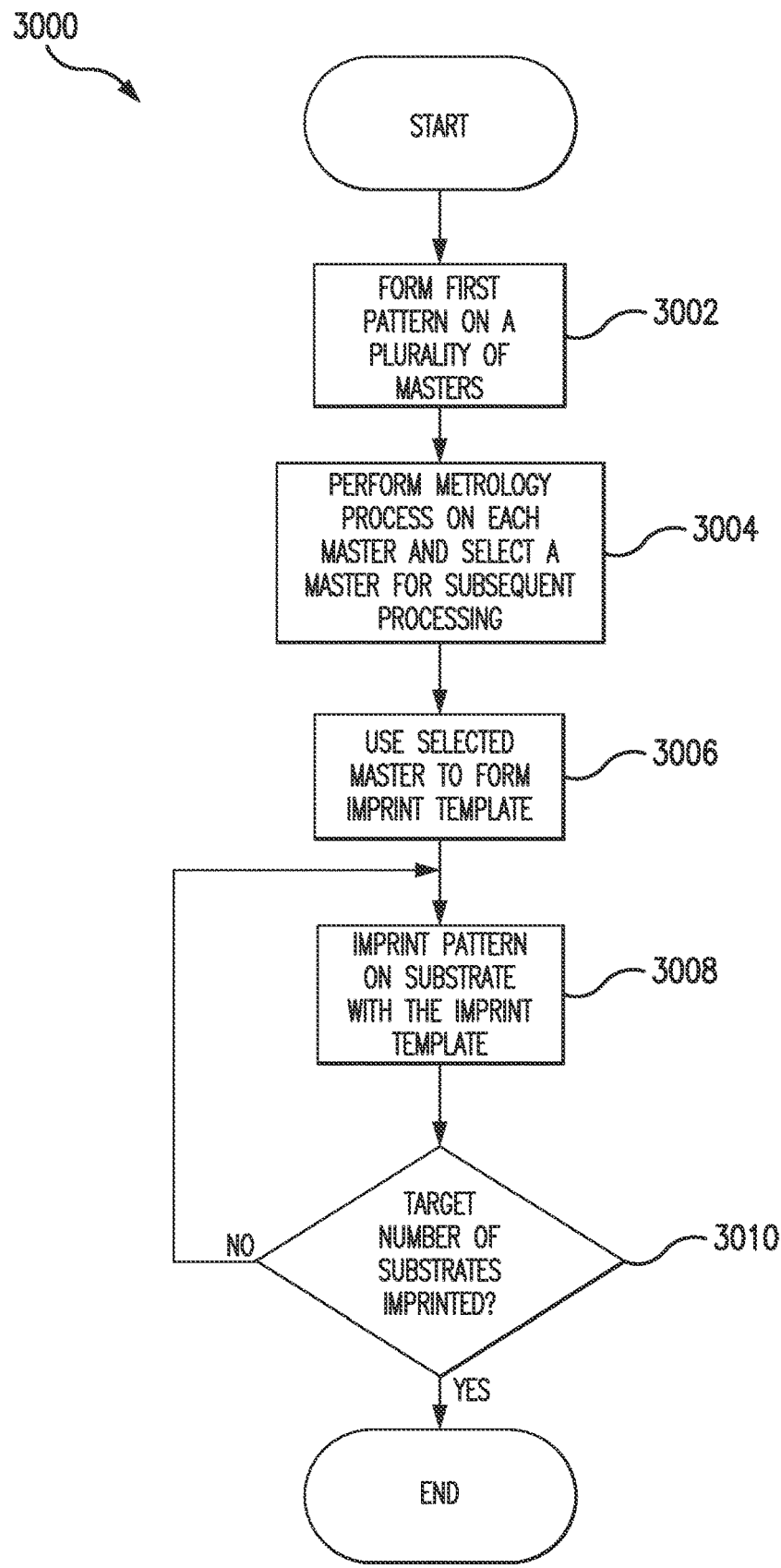
FIG. 3 is a process flow diagram of a method of imprinting a pattern on the optical device shown in FIG. 4I, according to one embodiment.
Figure 4A:
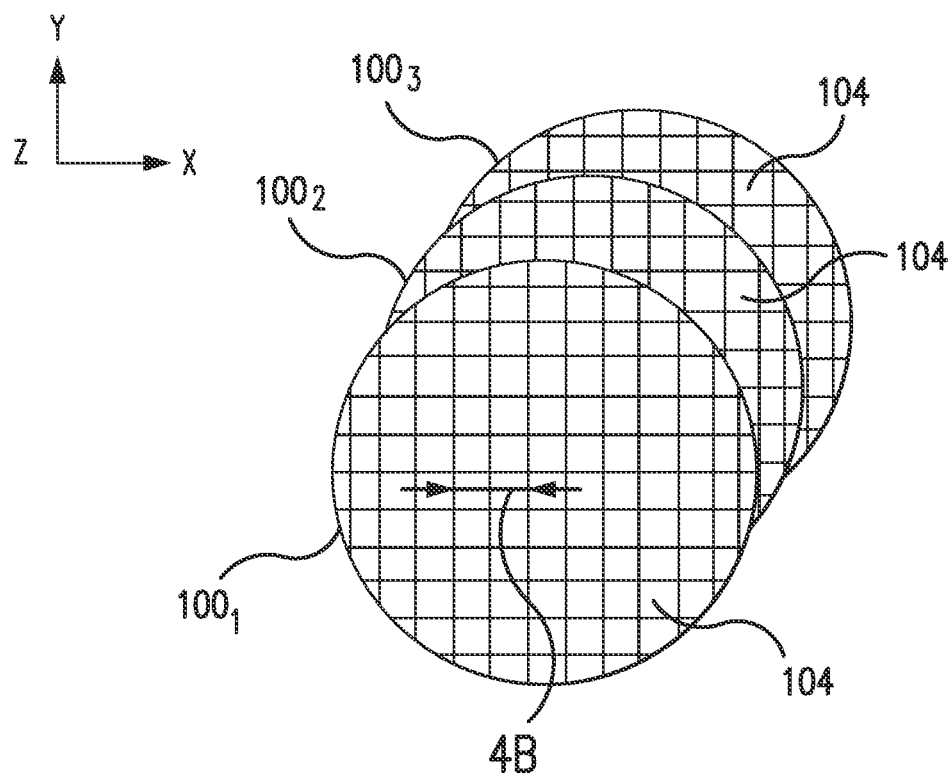
FIGS. 4A-4I show different stages of the method of FIG. 3 for forming the pattern on the optical device shown in FIG. 4I.
Figure 4B:
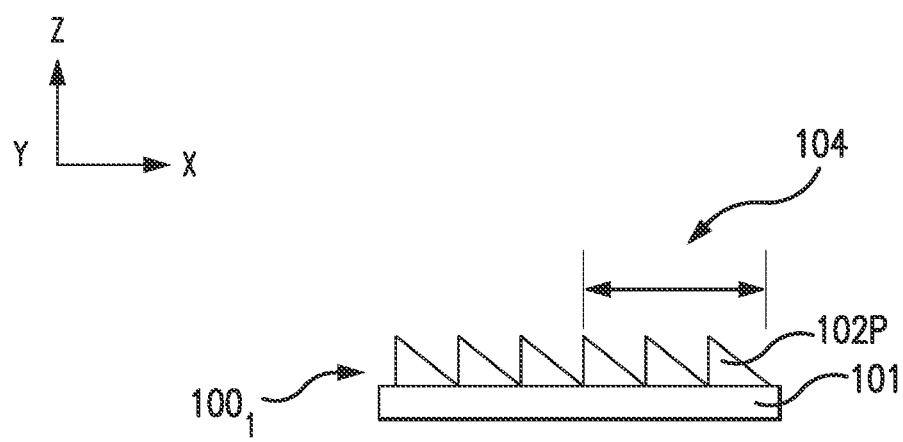
Figure 4C:
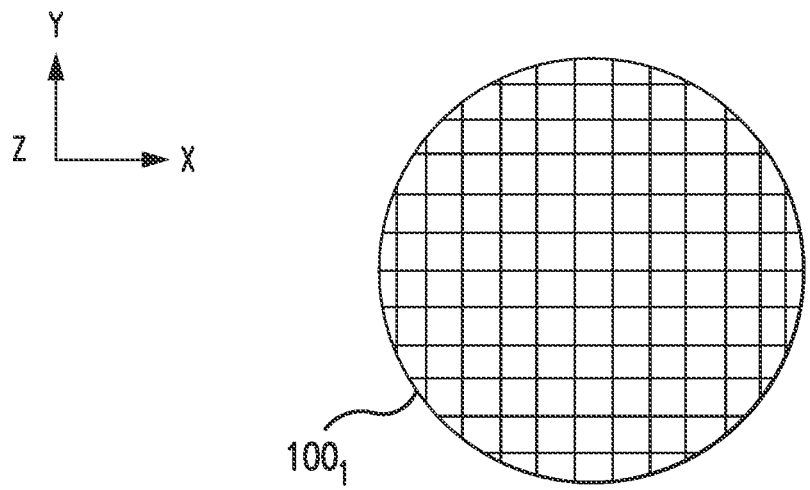
Figure 4D:
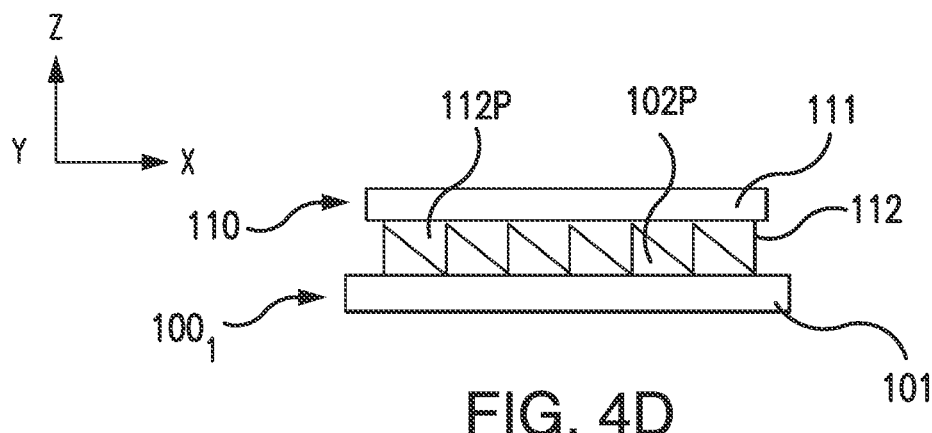
Figure 4E:
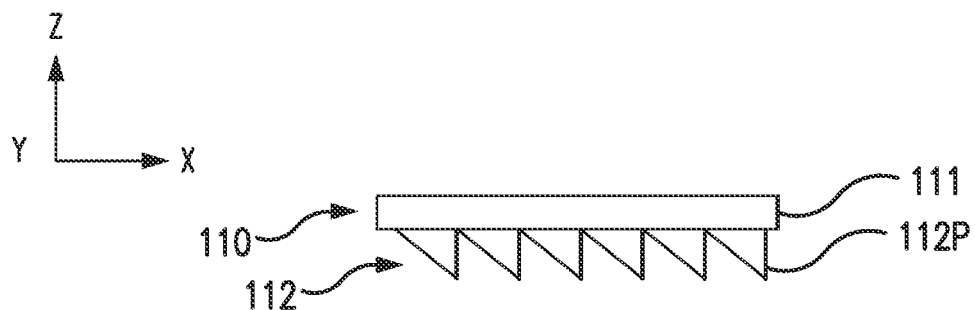
Figure 4F:
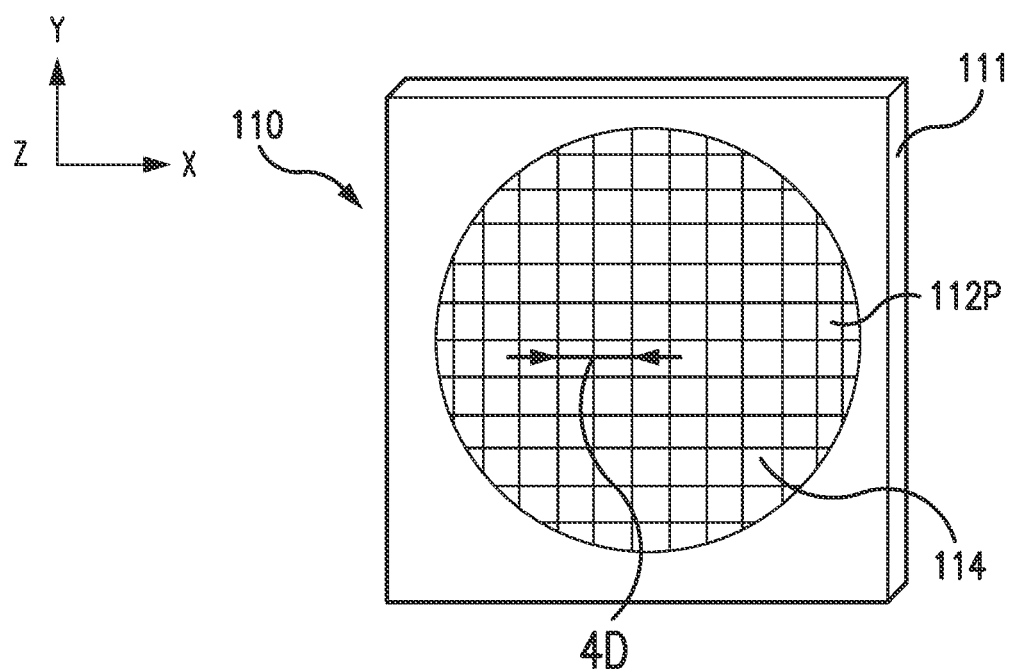
Figure 4G:
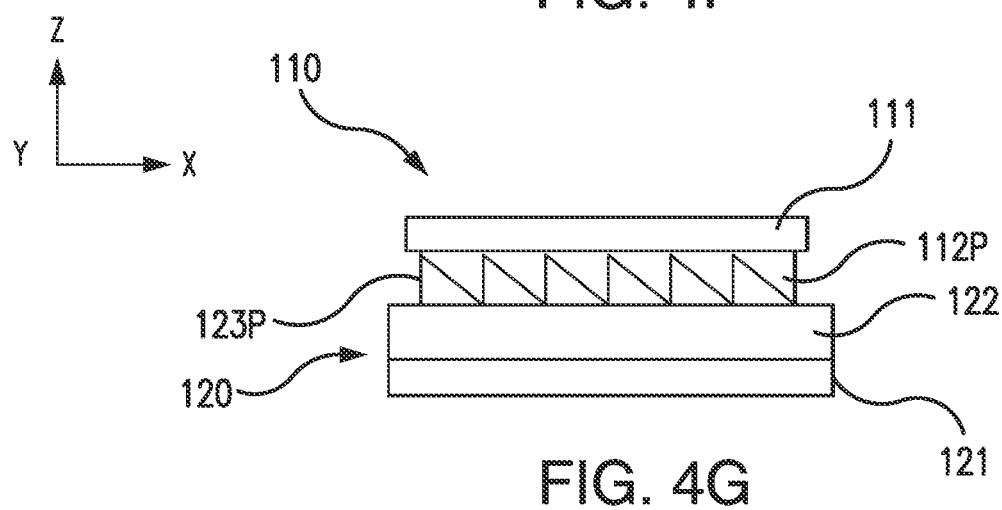
Figure 4H:
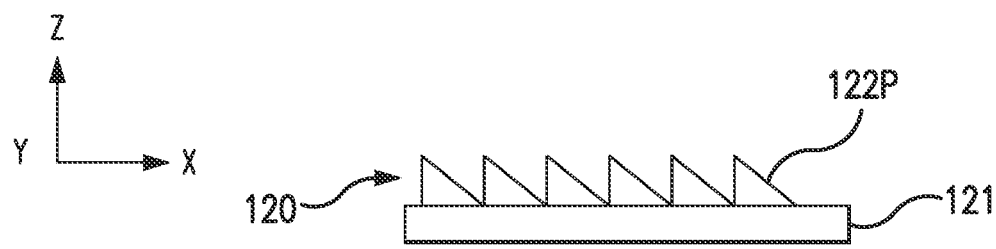
Figure 4I:
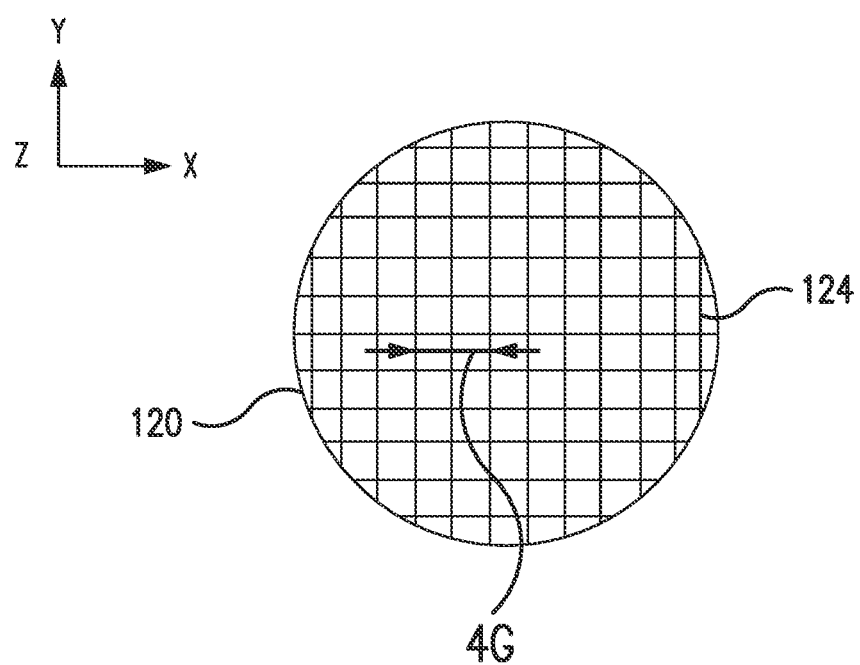

FIG. 3 is a process flow diagram of a method 3000 of imprinting a pattern on an optical device 120 as shown in FIG. 4I, according to one embodiment. The optical device 120 can be the same optical device 120 described above with reference to FIGS. 1 and 2A-21. Furthermore, the method 3000 includes many of the same operations as the method 1000 described above.

FIGS. 4A-4I show different stages of the method 3000 for forming the pattern on the optical device 120. The method 3000 is described with reference to FIG. 3 and FIGS. 4A-4I as well as additional reference to FIGS. 1 and 2A-21.

FIG. 4A is a top view of three masters $100_{1-3}$. FIG. 4B is a partial cross-sectional view of a first master $100_1$ taken along section line 4B of FIG. 4A. Each master 100 includes the patterned features 102P shown in FIG. 4B. The patterned features 102P are formed over the substrate 101 of each master 100. The patterned features 102P are the same patterned features 102P described above in reference to FIG. 2C. Three masters $100_1$-$100_3$ are shown in FIG. 4A, but two or more masters 100 can be used for the method 3000. With the exception of pattern differences relating to how accurately the patterned features 102P are formed on each individual master 100, each master 100 in FIG. 4A can be the same as the other masters 100 in FIG. 4A as well as the same as the master 100 described above in reference to FIGS. 1 and 2A-21.

Each master 100 includes a plurality of die 104 (i.e., each square-shaped region on each master 100 in FIG. 4A). Each die 104 on each master 100 can include a plurality of patterned features 102P as shown in FIG. 4B. For this illustration, each die 104 corresponds to three of the six triangular-shaped regions in FIG. 4B.

The method 3000 begins at block 3002. At block 3002, with reference to FIGS. 4A and 4B, the plurality of patterned features 102P are formed on each of the plurality of masters 100. The patterned features 102P can be formed on each master 100 using a method other than imprinting, such as methods using one or more of etching and/or non-imprint lithography processes (e.g., lithography using one or more forms of radiation or electron beam). In one embodiment, the greytone photolithography and etching process described above in reference to blocks 1002-1006 and FIGS. 2A-2C can be performed on each master 100 in FIG. 4A to form the patterned features 102P on each master 100.

At block 3004, with reference to FIGS. 4A and 4C, a metrology process is performed on each master 100, and a first master $100_1$ of the three masters $100_{1-3}$ is selected for subsequent processing as shown in FIG. 4C. For example, based on the measurements performed during the metrology process at block 3004, the master 100 having measurements most aligned with target measurements for a predetermined design can be chosen for subsequent processing. Various criteria can be used to determine which master 100 to choose. For example, in one embodiment, the master 100 having the least amount of variation of height in the Z-direction for the patterned features 102P from the intended structure height at various measurement locations (e.g., across 100 different locations on each master 100 or 100 different locations on each die 104 on each master 100) can be chosen as the most suitable master 100 for additional processing. In other embodiments, other measurements, such as structure width and structure position on the master can also be included for determining which master is the most suitable.

At block 3006, with reference to FIGS. 4D, 4E, and 4F, the selected first master $100_1$ is used to form the imprint template 110. The imprint template 110 can be same imprint template 110 described above with reference to FIG. 1 and FIGS. 2A-21. As described above, the imprint template 110 includes the base 111 and the imprint layer 112.

As shown in FIG. 4D, the selected first master $100_1$ can be used to imprint the patterned features 112P in the imprint layer 112 of the imprint template 110. As shown in FIG. 4E, the imprint template 110 is released from the first master $100_1$.

FIG. 4F shows a top view of the whole imprint template 110. The imprint template 110 can include die 114 (i.e., the square-shaped regions in FIG. 4F) arranged in a similar pattern to the die 104 described above in reference to FIG. 4A. Each die 114 can include the patterned features 112P. The views of the template 110 in FIGS. 4D and 4E can be partial cross-sectional views of the imprint template 110 along section line 4D of FIG. 4F.

At block 3008, with reference to FIGS. 4G, 4H, and 4I, the imprint template 110 can be used to form patterned features 122P (see FIG. 4H) on an optical device 120 (also referred to as substrates as the benefits of this disclosure are not limited to optical devices). The patterned features 122P can be formed on the optical device 120 in the same manner as described above in reference to blocks 1014-1018 of the method 1000 shown in FIG. 1. As shown in FIG. 4G, the imprint template 110 can be used to form patterned features 123P in an imprint resist layer 123 of the optical device 120. Then, after the imprint template 110 is released, the patterned features 123P of the imprint resist layer 123 and the underlying dielectric layer 122 can be etched back to form the plurality of patterned features 122P that are formed of portions of the dielectric layer 122 as shown in FIG. 4H.

FIG. 4I shows a top view of the whole optical device 120 formed using the method 3000. The optical device 120 can include die 124 (i.e., the square-shaped regions in FIG. 4I) arranged in a similar pattern to the die 104 described above in reference to FIG. 4A. Each die 124 can include the patterned features 122P shown in FIG. 4H. The views of the optical device 120 in FIGS. 4G and 4H can be partial cross-sectional views of the optical device 120 along section line 4G of FIG. 4I.

At block 3010, a determination is made as to whether a target number of optical devices 120 have been imprinted with the imprint template 110. Once the target number of optical devices 120 have been imprinted, the method 3000 can end. On the other hand, if the target number of optical devices 120 have not been imprinted with the template 110, then the imprint template 110 can be repeatedly used (e.g., hundreds of times, thousands of times, etc.) by re-executing block 3008 to form additional optical devices 120 with the same patterned features 123P shown in FIG. 4G and the patterned features 122P after the etching process as shown in FIG. 4H. By using the imprint template 110 to form the patterned features 122P of numerous optical devices 120, the patterned features 122P of the optical devices 120 can be formed with greater consistency and accuracy compared to forming the patterned features 122P by using other methods, such as forming the patterned features 122 using greytone photolithography without imprinting.

Figure 5:
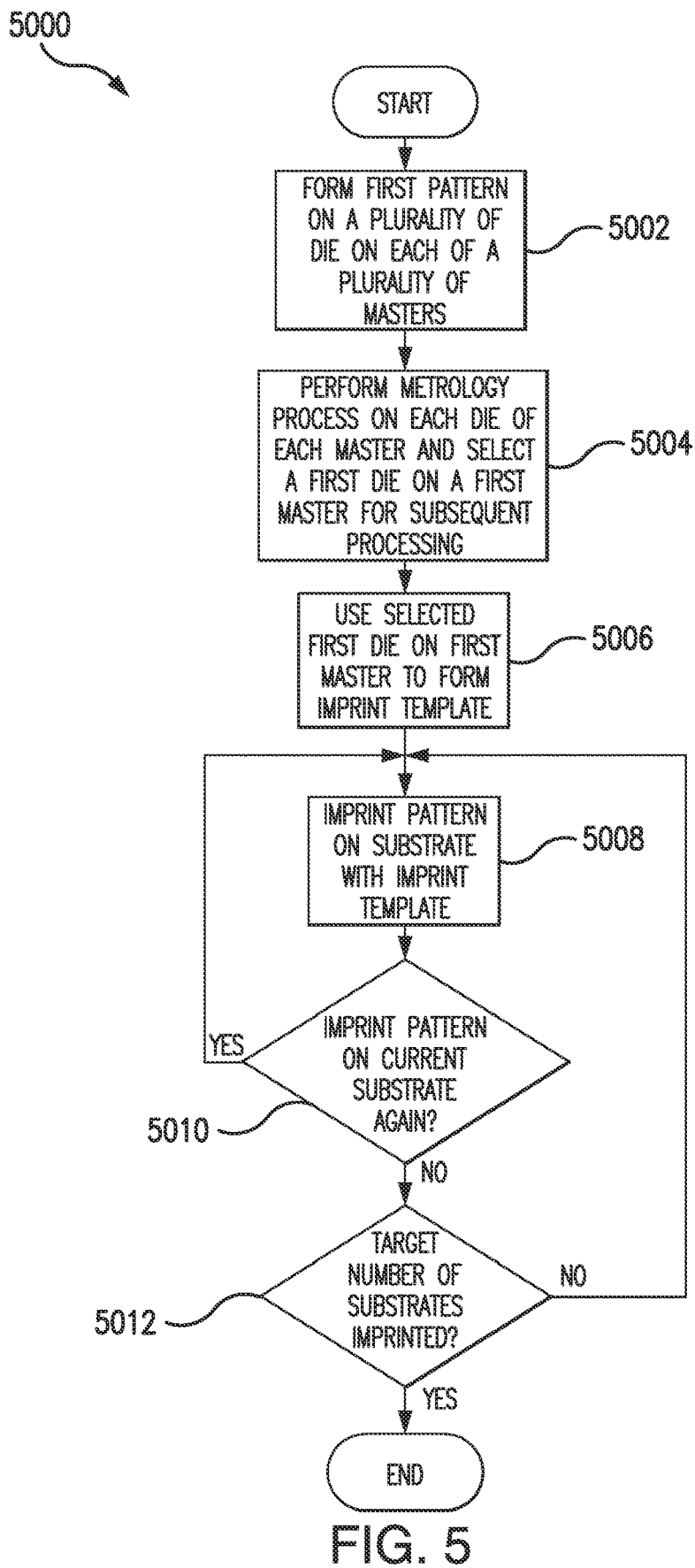
FIG. 5 is a process flow diagram of a method of imprinting a pattern on the optical device shown in FIG. 6H, according to one embodiment.
Figure 6A:
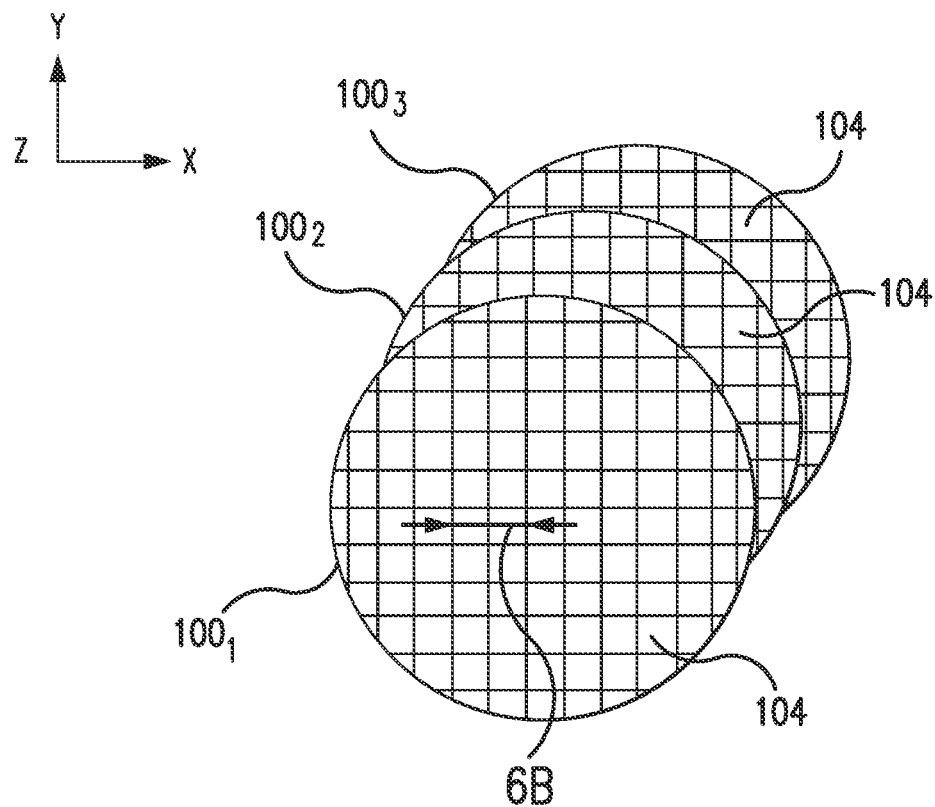
FIGS. 6A-6H show different stages of the method of FIG. 5 for forming the pattern on the optical device shown in FIG. 6H.
Figure 6B:
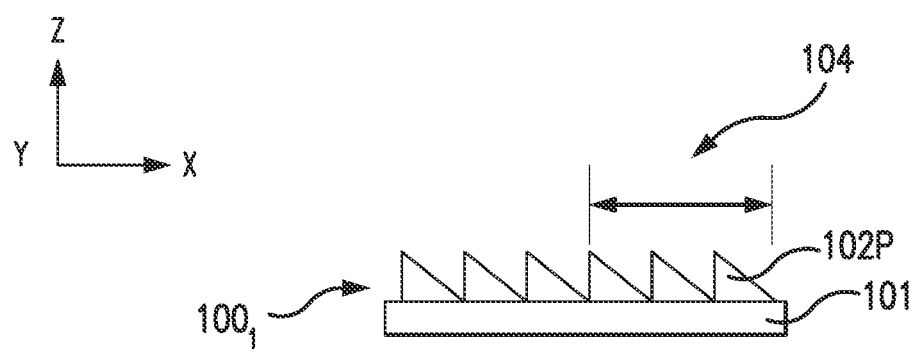
Figure 6C:
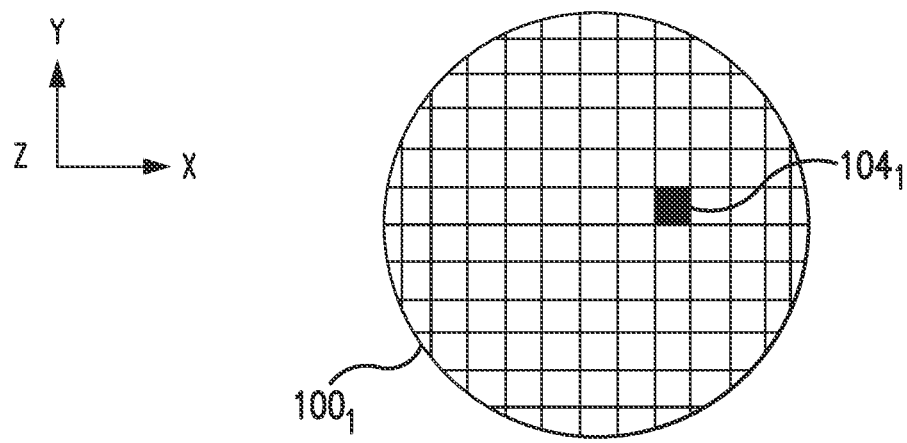
Figure 6D:
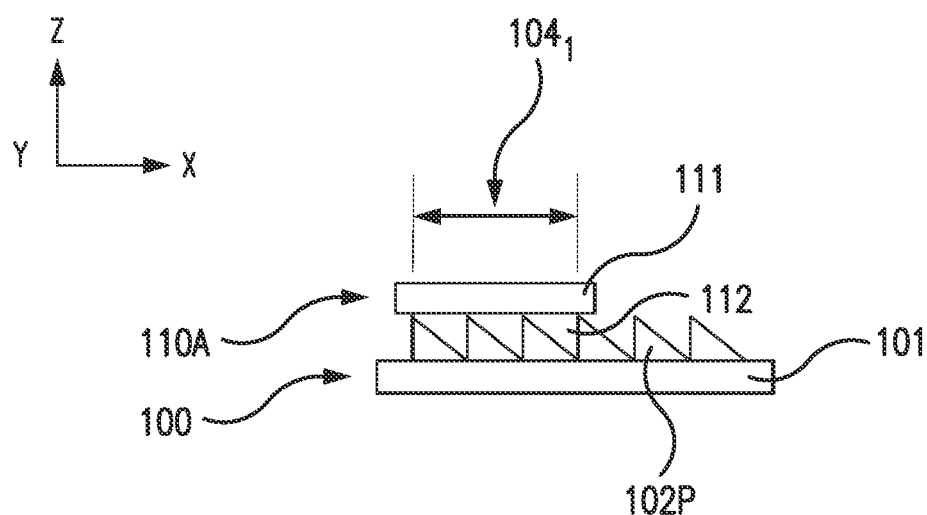
Figure 6E:
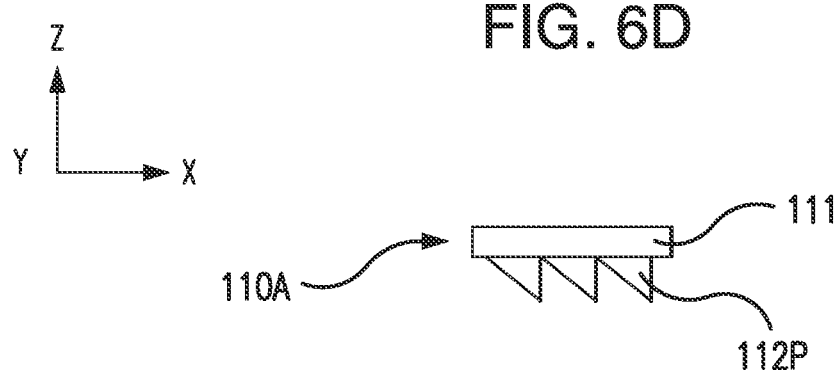
Figure 6F:
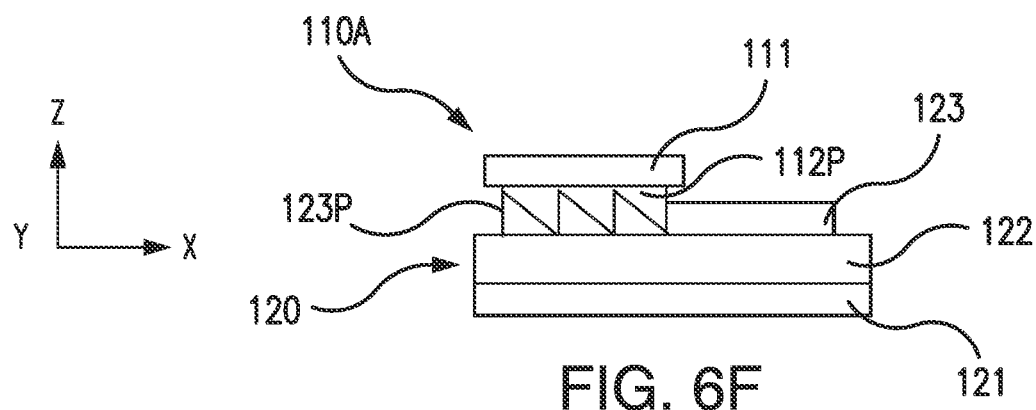
Figure 6G:
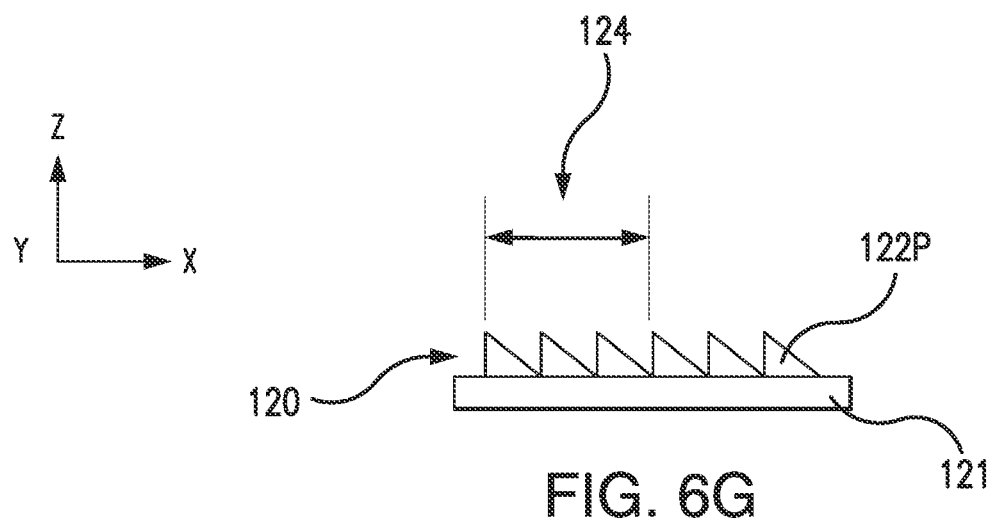
Figure 6H:
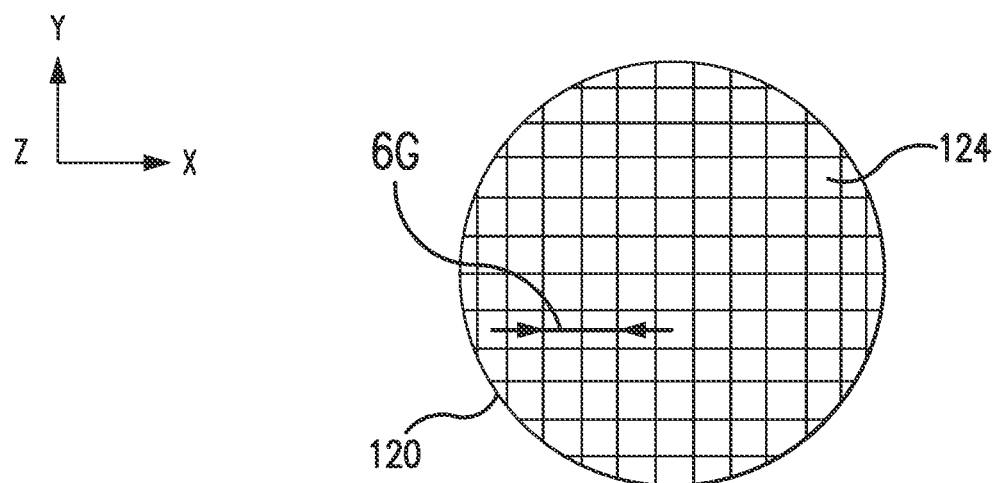

FIG. 5 is a process flow diagram of a method 5000 of imprinting a pattern on an optical device 120 shown in FIG. 6H, according to one embodiment. The optical device 120 can be the same optical device 120 described above with reference to FIGS. 1 and 2A-2I. Furthermore, the method 5000 includes many of the same operations as the method 1000 described above in reference to FIG. 1 and the method 3000 in reference to FIG. 3.

FIGS. 6A-6H show different stages of the method 5000 for forming the pattern on the optical device 120. The method 5000 is described with reference to FIG. 5 and FIGS. 6A-6H as well as additional reference to FIGS. 1 and 2A-2I.

FIGS. 6A and 6B are the same as FIGS. 4A and 4B described above. A brief overview of these Figures is provided here, and additional detail can be found above with reference to FIGS. 4A and 4B. FIG. 6A is a top view of three masters 100$_{1-3}$. FIG. 6B is a partial cross-sectional view of a first master 100$_1$ taken along section line 6B of FIG. 6A. Each master 100 includes a plurality of die 104 as shown in FIG. 6A. Each die 104 on each master 100 can include a plurality of patterned features 102P as shown in FIG. 6B. As illustrated, each die 104 corresponds to three of the six triangular-shaped regions in FIG. 6B.

The method 5000 begins at block 5002. At block 5002, with reference to FIGS. 6A and 6B, the plurality of patterned features 102P are formed on each of the plurality of masters 100. The patterned features 102P can be formed on each master 100 using a method other than imprinting, such as methods using one or more of etching or non-imprint lithography processes (e.g., lithography using one or more forms of radiation, electron beam, etc.). In one embodiment, the greytone photolithography and etching process described above in reference to blocks 1002-1006 and FIGS. 2A-2C can be performed on each master 100 in FIG. 6A to form the patterned features 102P on each die 104 of each master 100.

At block 5004, with reference to FIGS. 6A and 6C, a metrology process is performed on each die 104 of each master 100, and a first die 104$_1$ of the first master 100$_1$ of the three masters 100$_{1-3}$ is selected for subsequent processing. For example, based on the measurements performed during the metrology process at block 5004, the die 104$_1$ can have measurements most aligned with target measurements for a predetermined design. Various criteria can be used to determine which die 104 to choose. For example, in one embodiment, the die 104 having the least amount of variation of height in the Z-direction for the patterned features 102P from the intended structure height at various measurement locations (e.g., across 100 different locations on each die 104 on each master 100) can be chosen as the most suitable die 104 for additional processing.

At block 5006, with reference to FIGS. 6D and 6E, the selected first die 104$_1$ on the first master 100$_1$ is used to form an imprint template 110A. The imprint template 110A can be same as the imprint template 110 described above with reference to FIG. 3 and FIGS. 4A-4I except that the imprint template 110A is smaller having a size corresponding to the single die 104$_1$ as opposed to the size of the master 100. The imprint template 110A includes the base 111 and the imprint layer 112.

As shown in FIG. 6D, the selected first die 104$_1$ of the first master 100$_1$ can be used to imprint the patterned features 112P in the imprint layer 112 of the imprint template 110A. As shown in FIG. 6E, the imprint template 110A is released from the first master 100$_1$.

At block 5008, with reference to FIGS. 6F, 6G, and 6H, the imprint template 110A can be used as part of the process to form patterned features 122P (see FIG. 6G) on an optical device 120 (also referred to as substrates as the benefits of this disclosure are not limited to optical devices). In some embodiments, the patterned features 122P can be formed on the optical device 120 in the same manner as described above in reference to blocks 1014-1018 of the method 1000 shown in FIG. 1. As shown in FIG. 6F, the imprint template 110A can be used to form patterned features 123P on a portion of the imprint resist layer 123 of the optical device 120.

At block 5010, with reference to FIG. 6F, a determination can be made as to whether another imprint should be performed on the current optical device 120 with the imprint template 110A. Because the imprint template 110A is based on the size of a single die (i.e., the first die 104$_1$) as described above, forming patterns on an optical device 120 having a similar size as the masters 100 is accomplished with numerous imprints with the imprint template 110A. If another imprint is to be done on the current optical device 120, then either the optical device 120 or the imprint template 110A is stepped in a direction (e.g., a horizontal direction in the XY plane) and the next die-sized area of the imprint resist layer 123 is imprinted with the imprint template 110A. This process of stepping and imprinting other areas of the imprint resist layer 123 with the imprint template 110A continues until all of the target portions of the imprint resist layer 123 are imprinted with the imprint template 110A.

Then, after the imprint template 110A is released from the final portion of the imprint resist layer 123, the patterned features 123P of the imprint resist layer 123 and the underlying dielectric layer 122 can be etched back to form the plurality of patterned features 122P that are formed of portions of the dielectric layer 122 as shown in FIG. 6G.

FIG. 6H shows a top view of the whole optical device 120 formed using the method 5000. The optical device 120 can include die 124 (i.e., the square-shaped regions in FIG. 6H) arranged in a similar pattern to the die 104 described above in reference to FIG. 6A. Each die 124 can include the patterned features 122P. The view of the optical device 120 in FIG. 6G can be a partial cross-sectional view of the optical device 120 along section line 6G of FIG. 6H.

At block 5012, a determination is made as to whether a target number of optical devices 120 have been imprinted with the imprint template 110A. Once the target number of optical devices 120 have been imprinted, the method 5000 can end. On the other hand, if the target number of optical devices 120 have not been imprinted with the template 110A, then the imprint template 110A can be repeatedly used (e.g., hundreds of times, thousands of times, etc.) by re-executing block 5008 and 5010 to form additional optical devices 120 with the same patterned features 123P shown in FIG. 6F and the same patterned features 122P after the etching process as shown in FIG. 6G. By using the imprint template 110A to form the patterned features 122P of numerous optical devices 120, the patterned features 122P of the optical devices 120 can be formed with greater consistency and accuracy compared to forming the patterned features 122P by using other methods, such as using greytone photolithography without imprint lithography.

Figure 7:
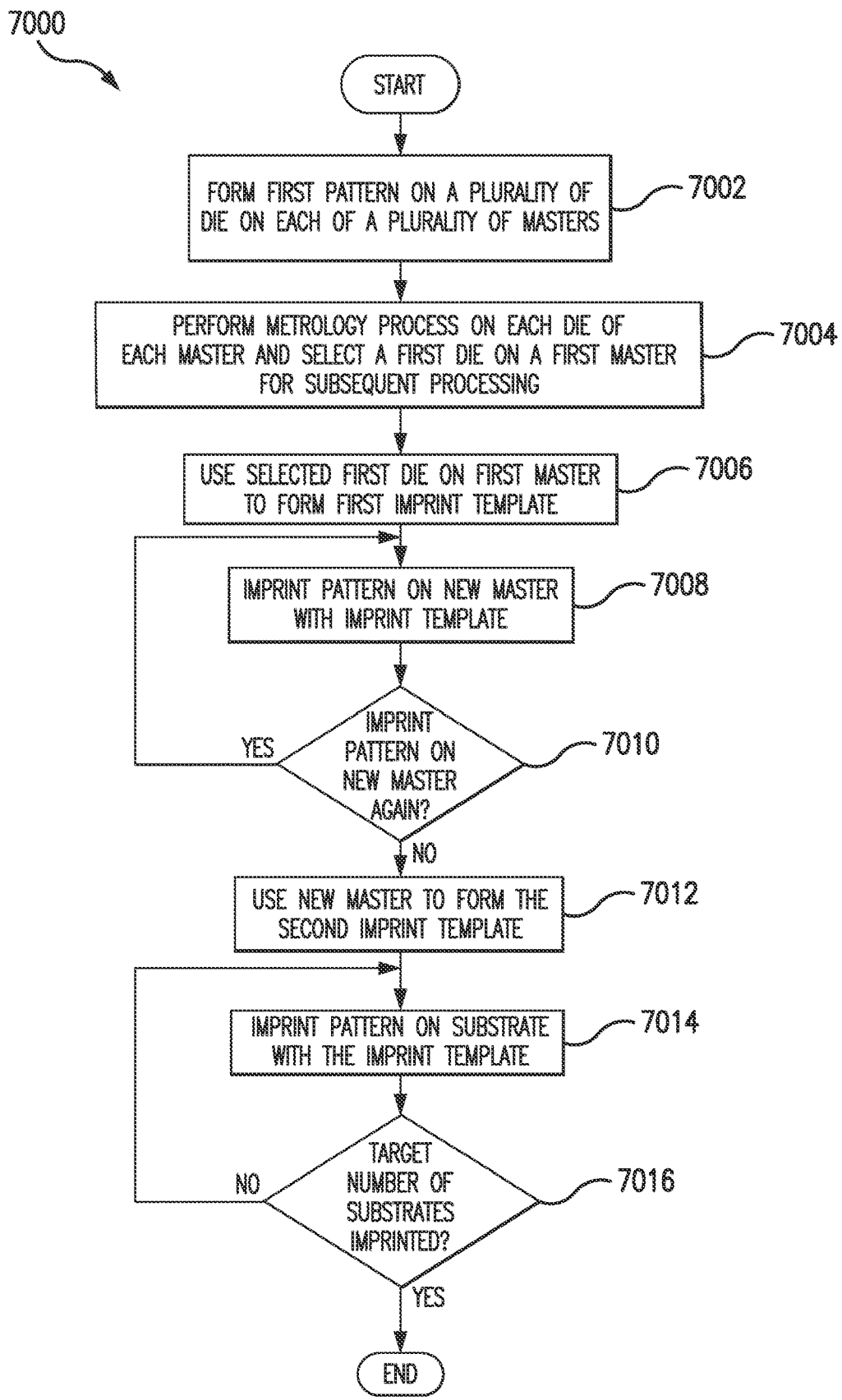
FIG. 7 is a process flow diagram of a method of imprinting a pattern on the optical device shown in FIG. 8N, according to one embodiment.
Figure 8A:
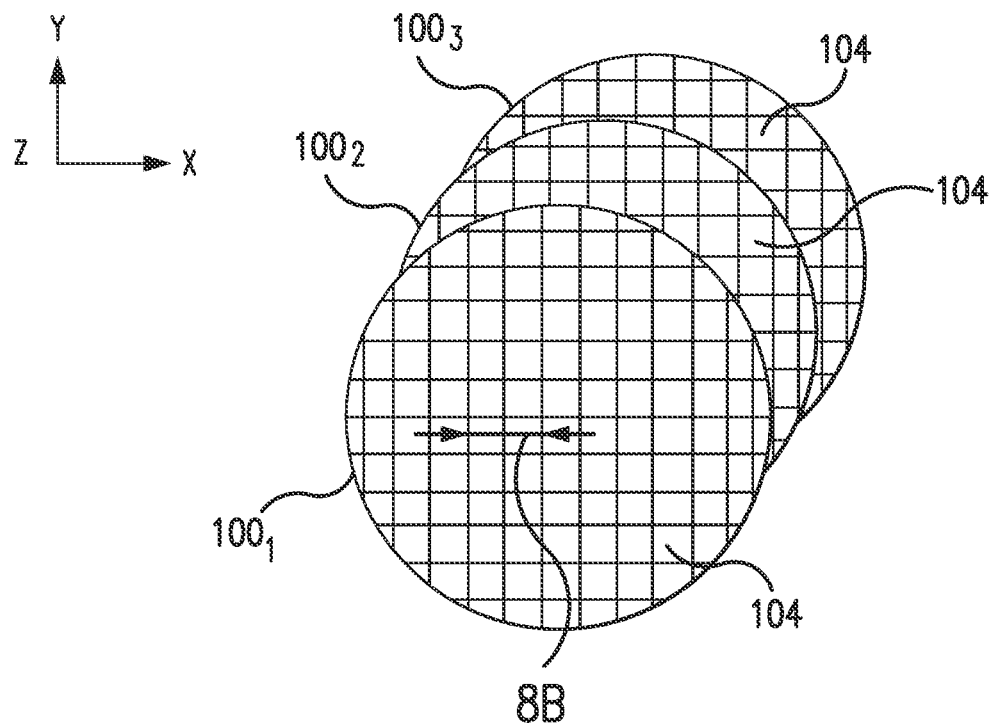
FIGS. 8A-8N show different stages of the method of FIG. 7 for forming the pattern on the optical device of FIG. 8N.
Figure 8B:
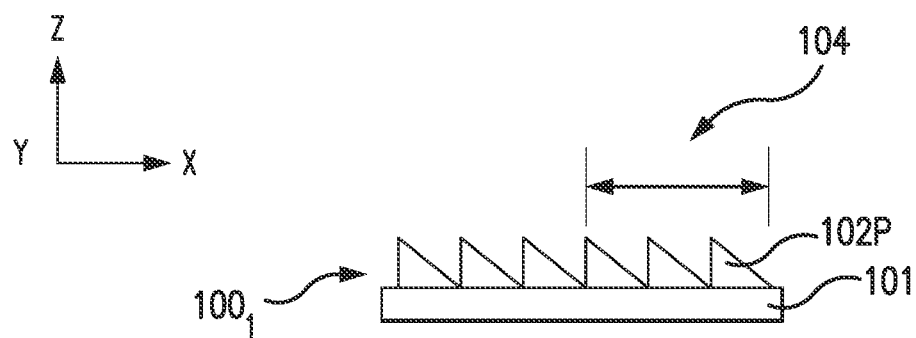
Figure 8C:
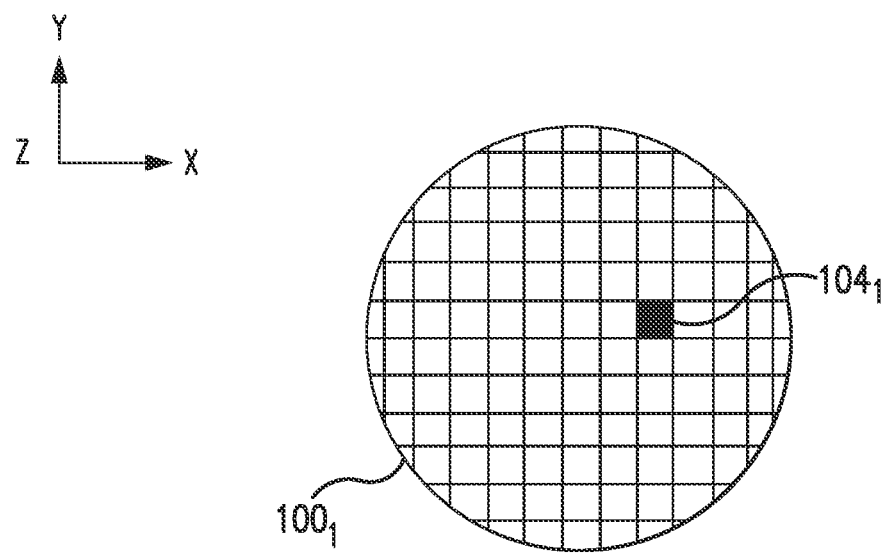
Figure 8D:
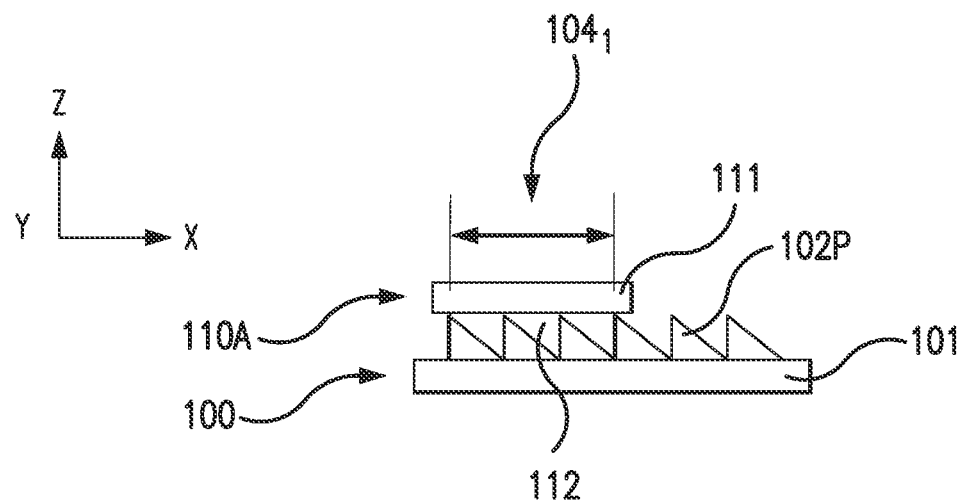
Figure 8E:
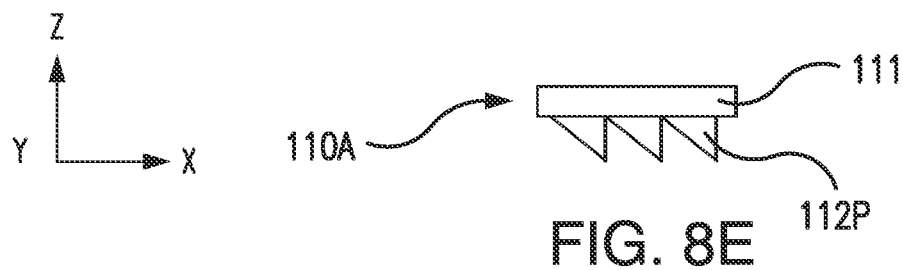
Figure 8F:
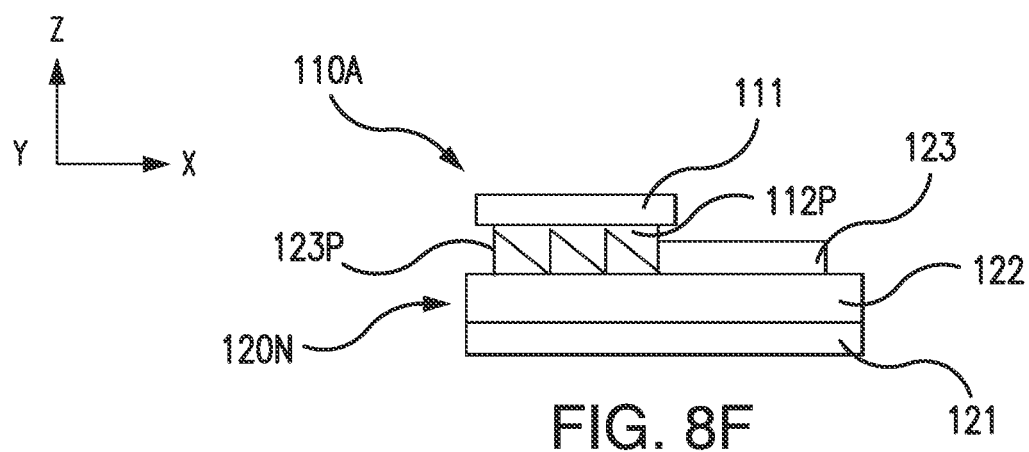
Figure 8G:
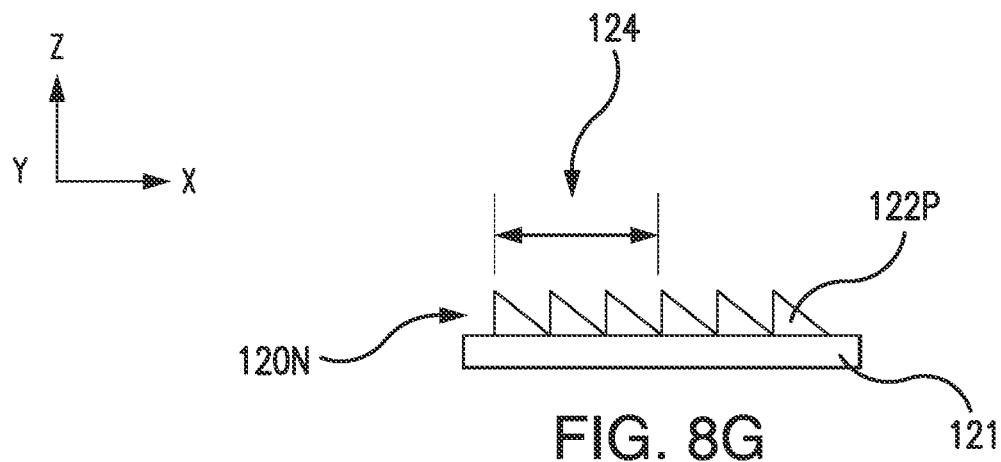
Figure 8H:
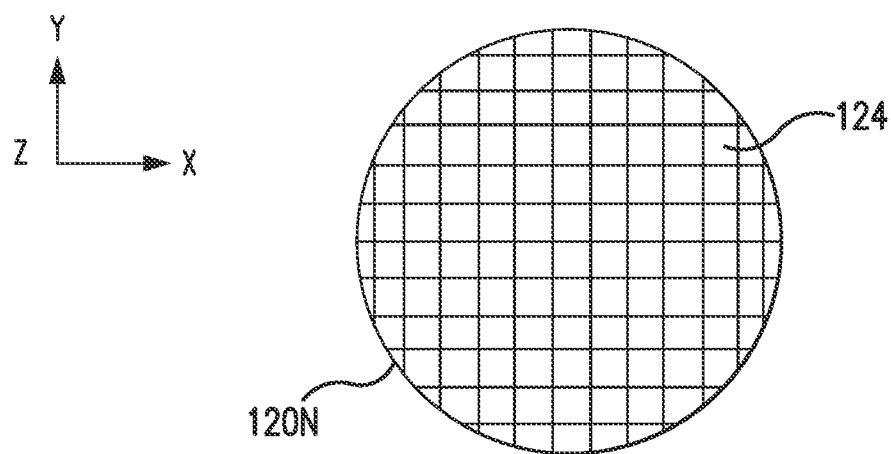
Figure 8I:
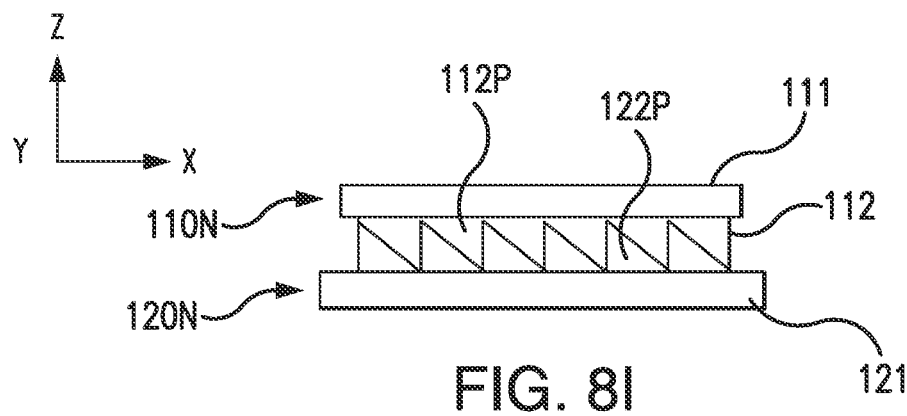
Figure 8J:
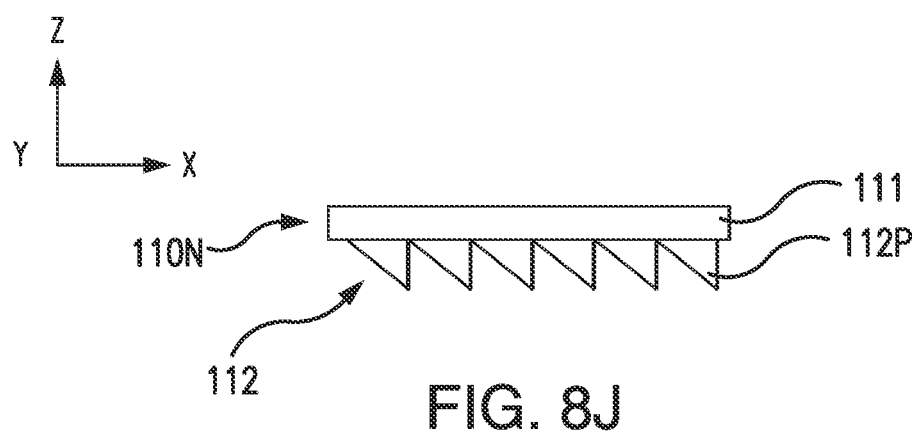
Figure 8K:
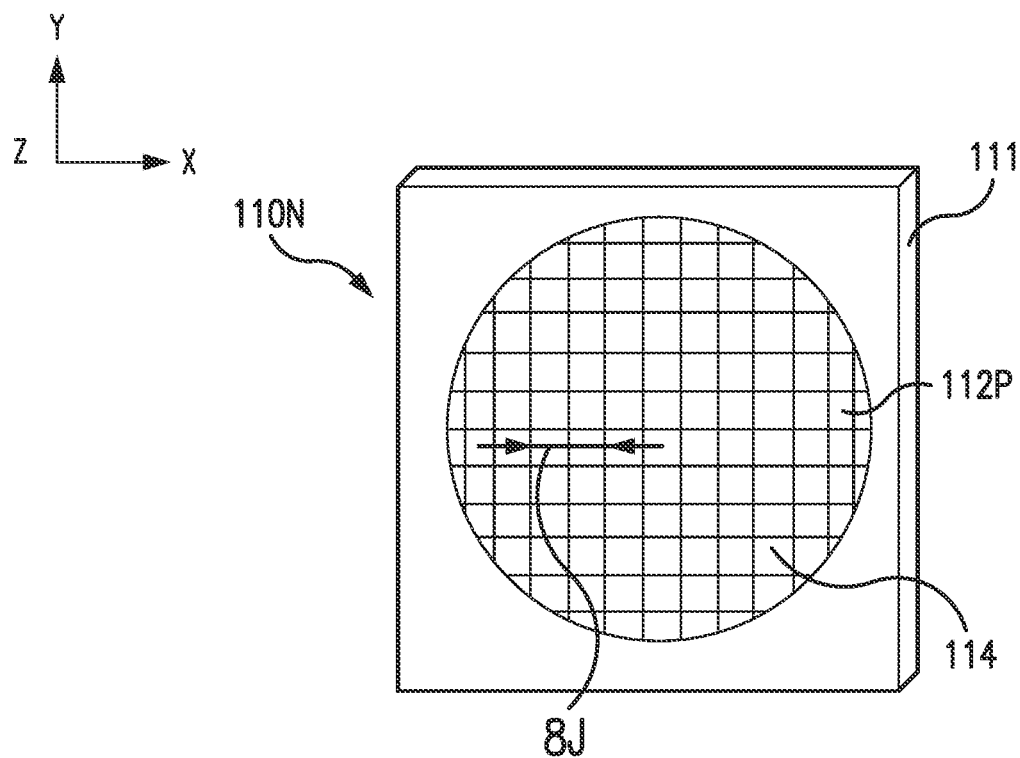
Figure 8L:
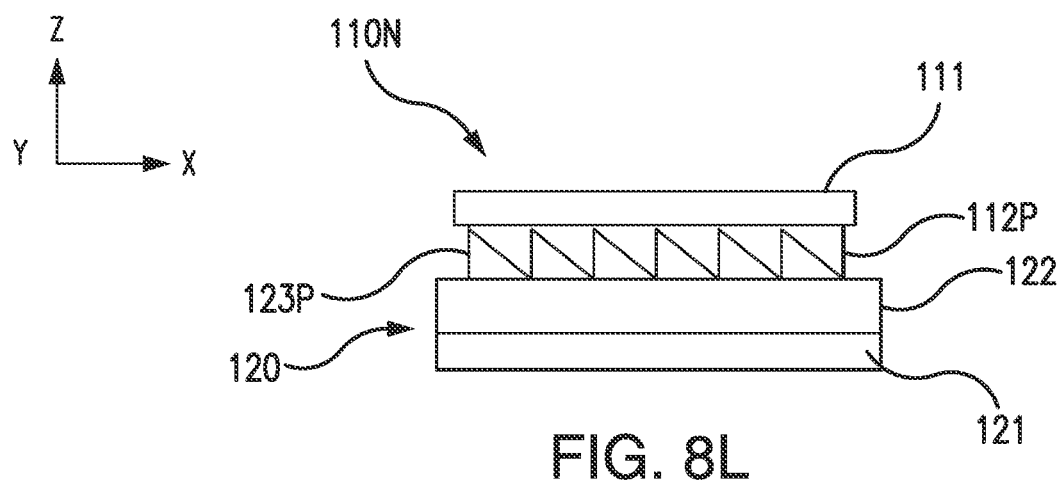
Figure 8M:
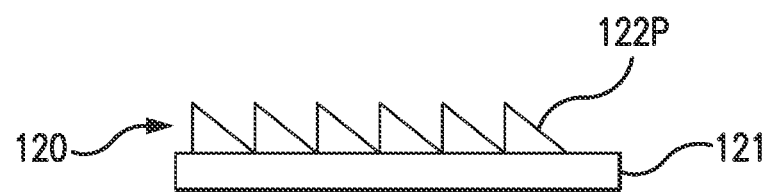
Figure 8N:
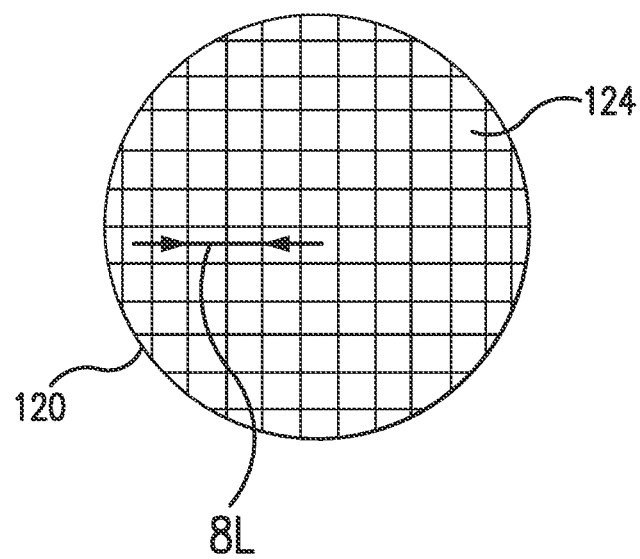

FIG. 7 is a process flow diagram of a method 7000 of imprinting a pattern on an optical device 120 as shown in FIG. 8N, according to one embodiment. The optical device 120 can be the same optical device 120 described above with reference to FIGS. 1 and 2A-2I. Furthermore, the method 7000 includes many of the same operations as the method 1000 described above in reference to FIG. 1, the method 3000 described above in reference to FIG. 3, and the method 5000 described above in reference to FIG. 5.

FIGS. 8A-8N show different stages of the method 7000 for forming the pattern on the optical device 120. The method 7000 is described with reference to FIG. 7 and FIGS. 8A-8N as well as additional reference to FIGS. 1 and 2A-2I.

FIGS. 8A and 8B are the same as FIGS. 4A and 4B described above. A brief overview of these Figures is provided here, and additional detail can be found above with reference to FIGS. 4A and 4B. FIG. 8A is a top view of three masters $100_{1-3}$. FIG. 8B is a partial cross-sectional view of a first master $100_1$ taken along section line 8B of FIG. 8A. Each master 100 includes a plurality of die 104 as shown in FIG. 8A. Each die 104 on each master 100 can include a plurality of patterned features 102P as shown in FIG. 8B. As illustrated, each die 104 corresponds to three of the six triangular-shaped regions in FIG. 8B.

The method 7000 begins at block 7002. At block 7002, with reference to FIGS. 8A and 8B, the plurality of patterned features 102P are formed on each of the plurality of masters 100. The patterned features 102P can be formed on each master 100 using a method other than imprinting, such as methods using one or more etching and/or non-imprint lithography processes (e.g., lithography using one or more forms of radiation, electron beam, etc.). In one embodiment, the greytone photolithography and etching process described above in reference to blocks 1002-1006 and FIGS. 2A-2C can be performed on each master 100 in FIG. 8A to form the patterned features 102P on each master 100.

At block 7004, with reference to FIGS. 8A and 8C, a metrology process is performed on each die 104 of each master 100, and a first die 104I of the first master $100_1$ of the three masters $100_{1-3}$ is selected for subsequent processing. For example, based on the measurements performed during the metrology process at block 7004, the first die 104I can have measurements most aligned with target measurements for a predetermined design. Various criteria can be used to determine which die 104 to choose. For example, in one embodiment, the die 104 having the least amount of variation of height in the Z-direction for the patterned features 102P from the intended structure height at various measurement locations (e.g., across 100 different locations on each die 104 on each master 100) can be chosen as the most suitable die 104 for additional processing.

At block 7006, with reference to FIGS. 8D and 8E, the selected first die 104I on the first master $100_1$ is used to form the imprint template 110A. The imprint template 110A can be same as the imprint template 110 described above with reference to FIG. 3 and FIGS. 4A-4I except that the imprint template 110A is smaller having a size corresponding to a single die (i.e., the first die 104I) as opposed to the size of the master 100. The imprint template 110A includes the base 111 and the imprint layer 112.

As shown in FIG. 8D, the selected first die 104I of the first master $100_1$ can be used to imprint the patterned features 112P in the imprint layer 112 of the imprint template 110A. As shown in FIG. 8E, the imprint template 110A is released from the first master $100_1$.

At block 7008, with reference to FIG. 8F, the imprint template 110A can be used to form patterned features 123P on a portion of the imprint resist layer 123 of a new master 120N. In some embodiments, the new master 120N can be the same as or include the same materials as the optical device 120 described above. In other embodiments, the new master 120N can include some of the materials used for the original master 100, such as the substrate 101 and the dielectric layer 102 from the master 100 along with the imprint resist layer 123 from the optical device 120. In other embodiments, the new master 120N can include one or more materials not used in either of the master 100 or the optical device 120.

At block 7010, with reference to FIG. 8F, a determination can be made as to whether another imprint should be performed on the new master 120N with the imprint template 110A. Because the imprint template 110A is based on the size of a single die 104I as described above, forming patterns on the new master 120N having a similar size as the masters 100 is accomplished with numerous imprints on the imprint resist layer 123 of the new master 120N with the imprint template 110A. If another imprint is to be done on the new master 120N, then either the new master 120N or the imprint template 110A is stepped in a direction (e.g., a horizontal direction in the XY plane) and the next area of the imprint resist layer 123 is imprinted with the imprint template 110A. This process of stepping and imprinting other areas of the imprint resist layer 123 of the new master 120N with the imprint template 110A continues until all of the target portions of the imprint resist layer 123 of the new master 120N are imprinted with the imprint template 110A.

Then, after the imprint template 110A is released from the final portion of the imprint resist layer 123 of the new master 120N, the patterned features 123P of the imprint resist layer 123 and the underlying dielectric layer 122 can be etched back to form the plurality of patterned features 122P that are formed of portions of the dielectric layer 122 as shown in FIG. 8G.

FIG. 8H shows a top view of the completed new master 120N. The new master 120N can include a plurality of die 124 arranged in the same pattern as the plurality of die 104 included in the first master $100_1$. The plurality of patterned features 122P in the new master 120N have less variation from the intended design than the plurality of patterned features 102P of the first master $100_1$ because each die 124 in the new master 120N is based off of an imprint derived using a template 110A formed from the first die 104I with the least amount of variation from the intended design out of all of the die 104 for all three of the original masters $100_{1-3}$.

At block 7012, with reference to FIGS. 8I, 8J, and 8K, the new master 120N is used to form a new imprint template 110N. The new imprint template 110N can be same as the imprint template 110 described above with reference to FIG. 1 and FIGS. 2A-2I. As described above, the imprint template 110N includes the base 111 and the imprint layer 112.

As shown in FIG. 8I, the new master 120N can be used to imprint the patterned features 112P in the imprint layer 112 of the new imprint template 110N. As shown in FIG. 8J, the new imprint template 110N is released from the new master 120N.

FIG. 8K shows a top view of the whole new imprint template 110N. The new imprint template 110N can include die 114 (i.e., the square-shaped regions in FIG. 8K) arranged in a similar pattern to the die 104 of the master 100 described above in reference to FIG. 8A. Each die 114 can include the patterned features 112P. The views of the template 110N in FIGS. 8I and 8J can be partial cross-sectional views of the new imprint template 110N along section line 8J of FIG. 8K. The patterned features 112P in each die 114 of the template 110N can be the same as the patterned features 112P in the template 110A of FIG. 8E, but the larger size of the new imprint template 110N allows the new imprint template 110N to imprint optical devices (e.g., optical device 120) more quickly than the smaller imprint template 110A shown in FIG. 8E.

At block 7014, with reference to FIGS. 8L and 8M, the new imprint template 110N can be used as part of the process to form patterned features 122P (see FIG. 8M) on an optical device 120 (also referred to as substrate as the benefits of this disclosure are not limited to optical devices). The patterned features 122P can be formed on the optical device 120 in the same manner as described above in reference to blocks 1014-1018 of the method 1000 shown in FIG. 1. As shown in FIG. 8L, the new imprint template 110N can be used to form patterned features 123P in an imprint resist layer 123 of the optical device 120. Then, after the new imprint template 110N is released, the patterned features 123P of the imprint resist layer 123 and the underlying dielectric layer 122 can be etched back to form the plurality of patterned features 122P that are formed of portions of the dielectric layer 122 as shown in FIG. 8M.

FIG. 8N shows a top view of the whole optical device 120 formed using the method 7000. The optical device 120 can include die 124 (i.e., the square-shaped regions in FIG. 8N) arranged in a similar pattern to the die 104 described above in reference to FIG. 8A. Each die 124 can include the patterned features 122P. The views of the optical device 120 in FIGS. 8L and 8M can be partial cross-sectional views of the optical device 120 along section line 8L of FIG. 8N.

At block 7016, a determination is made as to whether a target number of optical devices 120 have been imprinted with the new imprint template 110N. Once the target number of optical devices 120 have been imprinted, the method 7000 can end. On the other hand, if the target number of optical devices 120 have not been imprinted with the new imprint template 110N, then the new imprint template 110N can be repeatedly used (e.g., hundreds of times, thousands of times, etc.) by re-executing block 7014 to form additional optical devices 120 with the same patterned features 123P shown in FIG. 8L and the same patterned features 122P after the etching process as shown in FIG. 8M. By using the new imprint template 110N to form the patterned features 122P of numerous optical devices 120, the patterned features 122P of the optical devices 120 can be formed with greater consistency and accuracy compared to forming the patterned features 122P by using other methods, such as greytone photolithography without the use of imprint lithography.

Although the methods 5000 (FIG. 5) and 7000 (FIG. 7) are described as performing measurements on a plurality of masters to select a single die (e.g., the first die 1041), in some embodiments the measurements for these methods can be performed on a single master including two or more die to select a die that most closely matches the design. Furthermore, because the methods 5000 and 7000 use the smaller imprint template 110A as part of the process, there is no requirement that the final device (e.g., optical device 120) have a same size as the original master 100 as the smaller imprint template 110A can be used to apply the pattern to other masters or devices having a variety of sizes and/or shapes.

Although the above mainly describes forming patterns on optical devices, the benefits of the disclosure can be applied to any device or process that is used to imprint patterns. For example, the disclosure can provide benefits to any process that uses imprint lithography, such as use of imprint lithography in the semiconductor industry.

While the foregoing is directed to embodiments of the present disclosure, other and further embodiments of the disclosure may be devised without departing from the basic scope thereof, and the scope thereof is determined by the claims that follow.

What is claimed is:

1. A method of imprinting a pattern on a substrate, the method comprising:
    forming a first pattern on a plurality of masters, the first pattern including a plurality of patterned features;
    measuring the patterned features at a plurality of locations on each of the masters;
    selecting a first master of the plurality of masters based on the measurements of the patterned features on each of the masters; and
    using the first master to form a second pattern on an imprint template.

2. The method of claim 1, wherein the first pattern is formed on the plurality of masters using greytone photolithography.

3. The method of claim 1, further comprising imprinting the first pattern on a plurality of devices with the imprint template.

4. The method of claim 1, wherein each master includes a plurality of die spaced apart from each other, and using the first master to form to form the second pattern on the imprint template comprises imprinting the pattern from each die on the imprint template simultaneously.

5. The method of claim 1, wherein each master includes a plurality of die spaced apart from each other, and measuring the patterned features at a plurality of locations on each of the masters comprises performing measurements of the plurality of patterned features on each of the die.

6. The method of claim 1, further comprising using the first pattern formed on the first master to form a plurality of patterned features on an optical device.

7. The method of claim 6, wherein the plurality of patterned features of the optical device are a plurality of optical gratings of a waveguide combiner.

8. A method of imprinting a pattern on a substrate, the method comprising:
    forming a first pattern on a plurality of die on each of a plurality of masters, the first pattern on each die including a plurality of patterned features;
    measuring the patterned features at a plurality of locations on each die on each of the masters;
    selecting a first die on a first master of the plurality of masters based on the measurements of the patterned features on each die of each of the masters; and
    using the first die on the first master to form a second pattern on an imprint template.

9. The method of claim 8, further comprising:
    imprinting the first pattern on a first die of a first device with the imprint template; and
    imprinting the first pattern on a second die of the first device with the imprint template.

10. The method of claim 9, further comprising imprinting the first pattern on a plurality of devices other than the first device with the imprint template.

11. The method of claim 8, wherein the first pattern is formed on the plurality of masters using greytone photolithography.

12. The method of claim 8, further comprising using the first pattern formed on the first master to form a plurality of patterned features on an optical device.

13. The method of claim 12, wherein the plurality of patterned features of the optical device are a plurality of optical gratings of a waveguide combiner.

14. The method of claim 8, wherein the first die of the first master is selected based on the measurements of the patterned features of the first die having a least amount of variance from an intended design out of all of the die on all of the plurality of masters.

15. A method of imprinting a pattern on a substrate, the method comprising:
   forming a first pattern on a plurality of die on each of a plurality of masters using a method other than imprinting, the first pattern on each die including a plurality of patterned features;
   measuring the patterned features at a plurality of locations on each die on each of the masters;
   selecting a first die on a first master of the plurality of masters based on the measurements of the patterned features on each die of each of the masters;
   using the first die on the first master to form a second pattern on a first imprint template;
   imprinting the first pattern on each die of a plurality of die of a new master with the first imprint template; and
   using the plurality of die on the new master to form the second pattern on each die of a plurality of die on a second imprint template.

16. The method of claim 15, wherein the first pattern is formed on the plurality of masters using greytone photolithography.

17. The method of claim 15, further comprising imprinting the first pattern on a plurality of devices with the second imprint template.

18. The method of claim 15, further comprising using the first pattern formed on the first master to form a plurality of patterned features on an optical device.

19. The method of claim 18, wherein the plurality of patterned features of the optical device are a plurality of optical gratings of a waveguide combiner.

20. The method of claim 15, wherein the first die of the first master is selected based on the measurements of the patterned features of the first die having a least amount of variance from an intended design out of all of the die on all of the plurality of masters.

\* \* \* \* \*